United States Patent
Chia et al.

(10) Patent No.: US 8,037,377 B1
(45) Date of Patent: Oct. 11, 2011

(54) TECHNIQUES FOR PERFORMING BUILT-IN SELF-TEST OF RECEIVER CHANNEL HAVING A SERIALIZER

(75) Inventors: Ie Chen Chia, Sitiawan (MY); Eng Huat Lee, Ayer Itam (MY); Thow Pang Chong, Sungai Ara (MY); Boon Jin Ang, Butterworth (MY); Kar Keng Chua, Juru (MY)

(73) Assignee: Altera Corporation, San Jose, CA (US)

( * ) Notice: Subject to any disclaimer, the term of this patent is extended or adjusted under 35 U.S.C. 154(b) by 540 days.

(21) Appl. No.: 12/127,783

(22) Filed: May 27, 2008

(51) Int. Cl.
    *G01R 31/28* (2006.01)
(52) U.S. Cl. .................................. 714/712; 714/734
(58) Field of Classification Search .................. 714/712, 714/733, 734, 738–739; 375/219, 224, 226, 375/754; 370/241, 242; 341/100, 101, 111
See application file for complete search history.

(56) References Cited

U.S. PATENT DOCUMENTS

| | | | |
|---|---|---|---|
| 6,201,829 B1* | 3/2001 | Schneider | 375/221 |
| 6,724,328 B1* | 4/2004 | Lui et al. | 341/101 |
| 6,983,403 B2* | 1/2006 | Mayweather et al. | 714/704 |
| 7,005,875 B1 | 2/2006 | Natarajan et al. | |
| 7,191,371 B2* | 3/2007 | Hsu et al. | 714/717 |
| 7,363,563 B1* | 4/2008 | Hissen et al. | 714/733 |
| 7,460,040 B1* | 12/2008 | Tran et al. | 341/100 |
| 7,526,033 B2* | 4/2009 | Sindalovsky et al. | 375/257 |
| 7,539,242 B2* | 5/2009 | Yoshioka | 375/219 |
| 2003/0035473 A1* | 2/2003 | Takinosawa | 375/224 |
| 2003/0053565 A1* | 3/2003 | Yang et al. | 375/327 |
| 2004/0008762 A1* | 1/2004 | Garlett et al. | 375/224 |
| 2005/0047495 A1* | 3/2005 | Yoshioka | 375/219 |
| 2005/0058079 A1* | 3/2005 | Utsunomiya et al. | 370/242 |
| 2005/0076280 A1* | 4/2005 | Martinez | 714/733 |
| 2007/0092039 A1* | 4/2007 | Yang et al. | 375/327 |
| 2008/0240212 A1* | 10/2008 | Satou | 375/221 |

OTHER PUBLICATIONS

Sunter, S.; Roy, A.; Cote, J.-F.; , "An automated, complete, structural test solution for SERDES," Test Conference, 2004. Proceedings. ITC 2004. International , vol., no., pp. 95-104, Oct. 26-28, 2004.*
"The Evolution of High-Speed Transceiver Technology," Altera White Paper, Nov. 2002, ver. 1.0, pp. 1-15.
"7. Loopback Modes," Stratix GX Device Handbook, vol. 2, Altera Corporation, Jun. 2006, pp. 7-1 through 7-4.
"8. StratixGX Built-In Self Test (BIST)," Stratix GX Device Handbook, vol. 2, Altera Corporation, Aug. 2005, pp. 8-1 through 8-22.

* cited by examiner

*Primary Examiner* — Cynthia Britt
(74) *Attorney, Agent, or Firm* — Steven J. Cahill

(57) ABSTRACT

A circuit includes a receiver channel and a built-in self-test circuit. The receiver channel has a serializer and a deserializer. The built-in self-test circuit generates test signals that are transmitted in parallel to the serializer during a test of the receiver channel. The serializer converts the test signals into serial test signals. The deserializer converts the serial test signals into parallel test signals that are transmitted to the built-in self-test circuit.

22 Claims, 5 Drawing Sheets

US 8,037,377 B1

TECHNIQUES FOR PERFORMING BUILT-IN SELF-TEST OF RECEIVER CHANNEL HAVING A SERIALIZER

BACKGROUND OF THE INVENTION

The present invention relates to electronic circuits, and more particularly, to techniques for performing a built-in self-test of a receiver channel having a serializer.

FIG. 1 is a diagram of a prior art dynamic phase alignment (DPA) built-in self-test (BIST) structure, a receiver channel, and a transmitter channel. Built-in self-test (BIST) refers to a circuit design or testing technique within an integrated circuit (IC) that is used to verify the operation of circuit blocks in the same IC. The transmitter channel includes output buffer 102 and serializer 114. The receiver channel includes input buffer 101, multiplexer 103, dynamic phase alignment (DPA) block 104, first-in-first-out (FIFO) buffer 105, multiplexer 106, bit-slip (BSLIP) block 107, and deserializer 108. The DPA BIST structure of FIG. 1 includes test verifier 110, test pattern generator 111, DPA BIST controller 112, and DPA BIST interface block 113.

Test pattern generator 111 generates test signals. DPA BIST interface block 113 transmits the test signals in parallel through a 10-bit bus to serializer 114 in the transmitter channel. The parallel test signals are serialized in serializer 114. The serialized test signals are transmitted to DPA block 104 through multiplexer 103, then to FIFO buffer 105, then to bit-slip block 107 through multiplexer 106, and then to deserializer 108 in the receiver channel. Deserializer 108 deserializes the test signals. Test verifier 110 then verifies the deserialized test signals.

BRIEF SUMMARY OF THE INVENTION

According to some embodiments of the present invention, a circuit includes a receiver channel and a built-in self-test circuit. The receiver channel has a serializer and a deserializer. The built-in self-test circuit generates test signals that are transmitted in parallel to the serializer during a test of the receiver channel. The serializer converts the test signals into serial test signals. The deserializer converts the serial test signals into parallel test signals that are transmitted to the built-in self-test circuit.

According to other embodiments of the present invention, a method for testing a receiver channel includes generating test signals during a built-in self-test. The test signals are transmitted in parallel to the receiver channel. The test signals are serialized to generate serial test signals in the receiver channel. The serial test signals are deserialized to generate parallel test signals in the receiver channel. The parallel test signals are verified during the built-in self-test. The present invention includes methods and systems for performing the embodiments described herein.

Various objects, features, and advantages of the present invention will become apparent upon consideration of the following detailed description and the accompanying drawings.

DETAILED DESCRIPTION OF THE INVENTION

Figure 1:
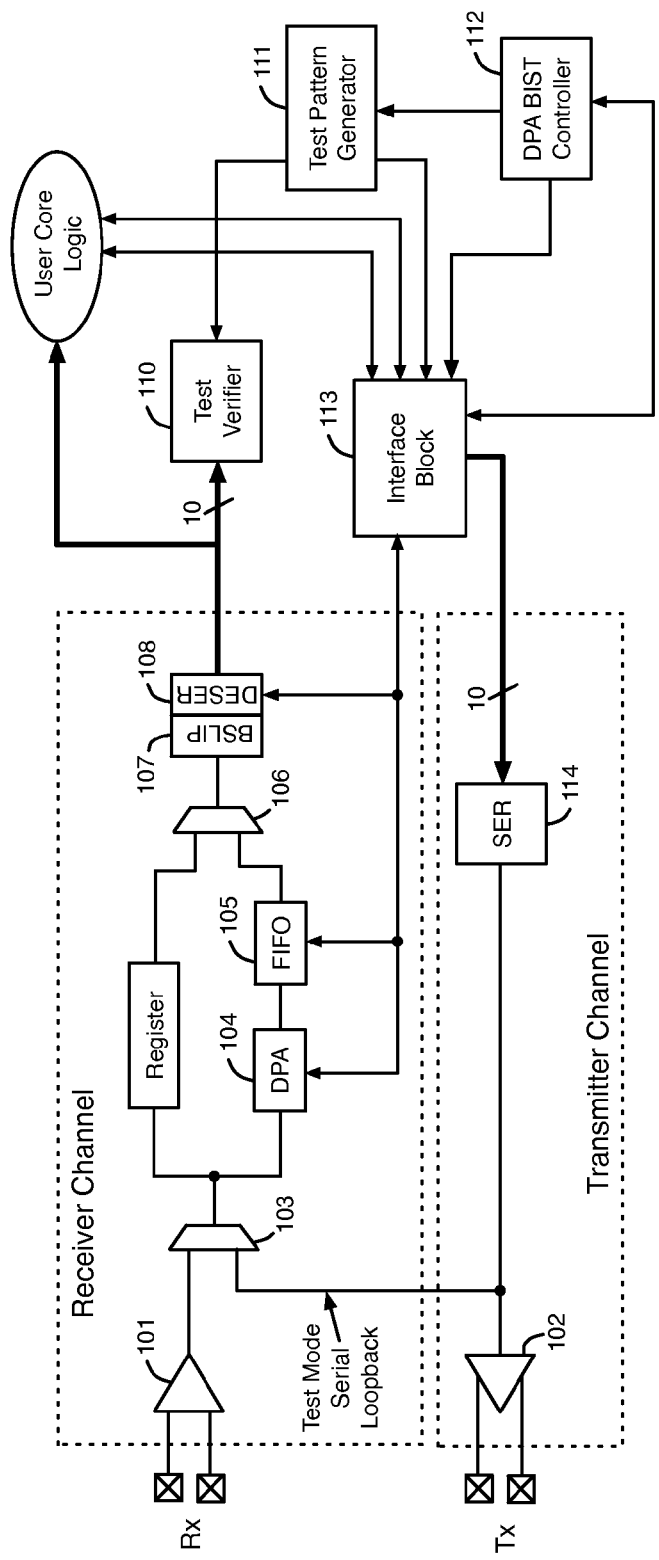
FIG. 1 is a diagram of a prior art dynamic phase alignment (DPA) built-in self-test (BIST) structure, a receiver channel, and a transmitter channel.

Transmitter and receiver channels can be tested using built-in self-test (BIST) circuitry as shown in FIG. 1. The BIST circuitry tests the receiver channel and the transmitter channel at the same time. The receiver and transmitter channels are grouped into pairs on the integrated circuit. On-chip BIST circuitry can be used to test a receiver and transmitter channel pair at the maximum channel frequency (i.e., at-speed).

However, the receiver and transmitter channel pairs do not exist in some integrated circuits. For example, in some application specific integrated circuits (ASICs), the arrangement of the receiver and transmitter channels may depend on the user design, and unused channels are removed to save cost. Thus, some of the receiver channels are not paired next to a transmitter channel in the integrated circuit die layout of some ASICs.

A receiver channel should be tested at its maximum operating frequency in order to verify the correct operation of the dynamic phase alignment (DPA) block in the receiver channel. At-speed testing for a receiver channel DPA block cannot be replaced with low speed functional testing using an external tester to achieve adequate test coverage for the DPA block.

Functional testing is performed at a low speed using an external tester to verify the functionality of a device under test. The test pattern is predefined according to the circuit functionality. The external tester transmits the test pattern into the integrated circuit, and the test pattern propagates to registers in a register scan chain.

In order to preserve the receiver and transmitter channel pairs, an extra transmitter channel can be instantiated on the integrated circuit next to each unpaired receiver channel to enable at-speed testing of the receiver channel using BIST circuitry, even when the user design does not use the extra transmitter channel. An unused transmitter channel does not drive any output signals. Many unused transmitter channels on an integrated circuit may increase the die size of the integrated circuit significantly and may require extra input/output pins. A larger die size and extra pins are undesirable, because they increase the cost and the area of the integrated circuit.

BIST circuitry may not be able to generate test signals at the maximum frequency of the receiver channel (e.g., 1 GHz). Therefore, a serializer serializes parallel test signals generated by the BIST circuitry in order to generate serialized test signals at the maximum frequency of the receiver channel. The serialized test signals are transmitted to the receiver channel and used to test the receiver channel at its maximum frequency. The transmitter output buffer is not used in the at-speed testing implemented by the BIST circuitry. Only the serializer within the transmitter channel is used in the at-speed testing of the receiver channel.

According to an embodiment of the present invention, a serializer is incorporated into a receiver channel as a built-in design for test (DFT) block within the receiver channel, instead of instantiating a whole design for test (DFT) transmitter channel next to each receiver channel. The receiver channel operates as an independent block that does not rely on a transmitter channel for testing. A complete design for test (DFT) circuit exists inside the receiver channel. The omitted transmitter channel is substituted with a serializer that is much smaller than the whole transmitter channel. DFT is a design technique where certain testability features are inserted during the design stage to facilitate a manufacturing testing process.

Figure 2:
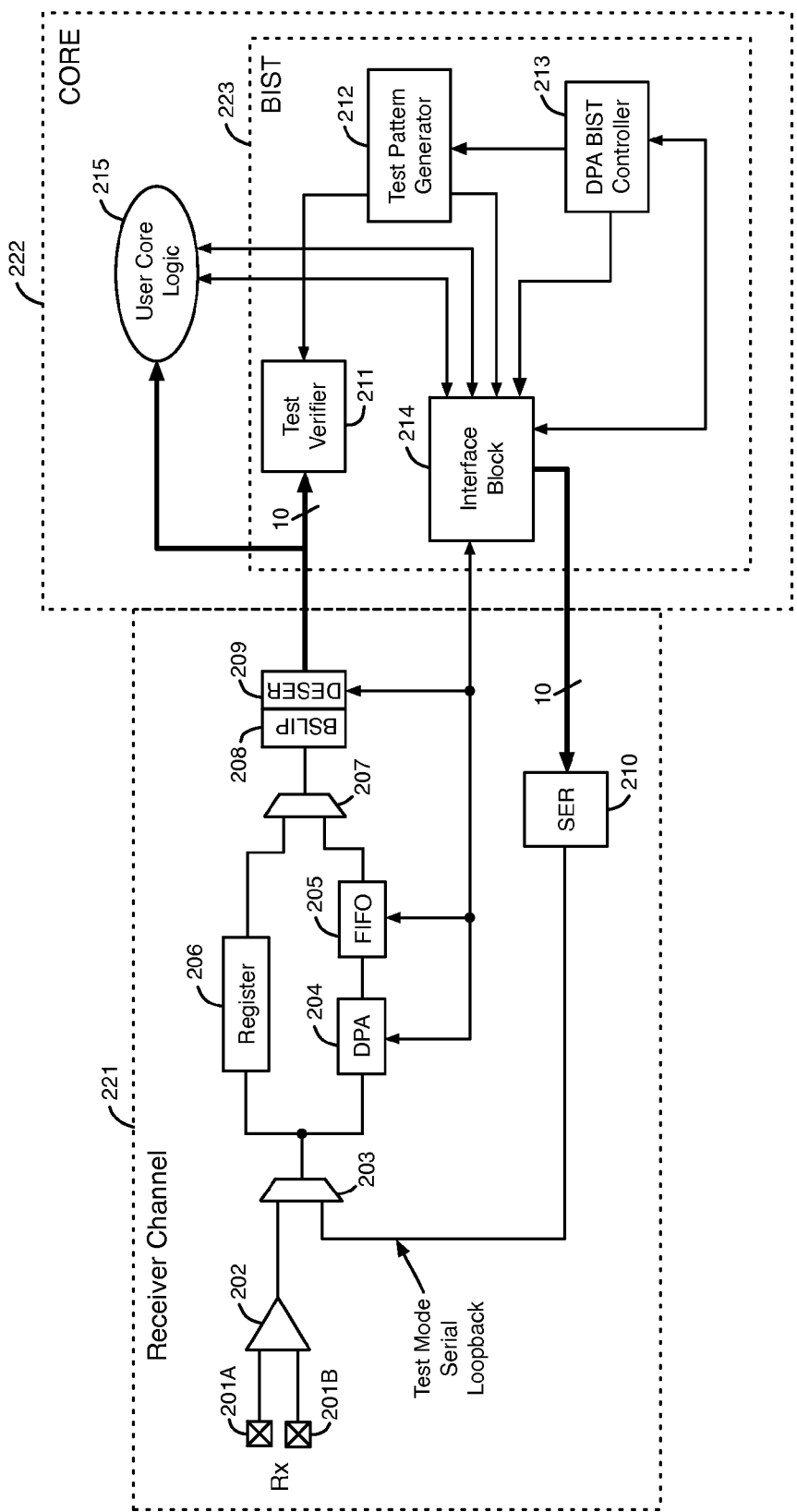
FIG. 2 is a diagram of a BIST circuit and a receiver channel that includes a design for test (DFT) serializer, according to an embodiment of the present invention.

FIG. 2 is a diagram of a built-in self-test (BIST) circuit and a receiver channel that includes a design for test (DFT) serializer, according to an embodiment of the present invention. FIG. 2 illustrates a low voltage differential signaling (LVDS) receiver channel 221 and core logic 222 on an application specific integrated circuit (ASIC). The ASIC can, for example, be based on a user design for a programmable integrated circuit or from a Register Transfer Level (RTL) file generated by a user. Programmable integrated circuits include field programmable gate arrays (FPGAs) and programmable logic devices (PLDs).

Receiver channel 221 includes differential input pins 201A and 201B of the integrated circuit, low voltage differential signaling (LVDS) input buffer 202, multiplexer 203, dynamic phase alignment (DPA) block 204, first-in-first-out (FIFO) buffer 205, LVDS input register 206, multiplexer 207, bit-slip (BSLIP) block 208, deserializer 209, and serializer 210. Input buffer 202 has two input terminals coupled to pins 201A and 201B. Receiver channel 221 does not include an output buffer coupled to output pins of the integrated circuit. Pins 201A-201B are external terminals of the integrated circuit.

Core logic 222 can contain complex hybrid logic elements (CHLEs). CHLEs are programmable. Alternatively, core logic 222 can be built with logic cells that are not programmable. The non-programmable logic cells are placed on the integrated circuit using standard logic cell place and route techniques. Built-in self-test (BIST) circuit 223 is built using logic circuits in core logic 222. BIST 223 can be built from programmable logic circuits (e.g., CHLEs) or from non-programmable logic cells in core logic 222.

BIST circuit 223 includes test verifier 211, test pattern generator 212, DPA BIST controller 213, and DPA BIST interface block 214. BIST circuit 223 may be dedicated to receiver channel 221, or alternatively, BIST circuit 223 can be used to perform built-in self-tests of multiple receiver channels on the same integrated circuit. Logic circuits in core logic 222 that implement features of a user's design are represented by block 215. The logic circuits in block 215 that implement the user's design can be, for example, CHLEs or non-programmable place and route logic cells.

During a built-in self-test of receiver channel 221, test pattern generator 212 generates a sequence of test data signals that are transmitted to interface block 214. Interface block 214 transmits the test data signals in parallel to serializer 210 along a bus having parallel signal lines in response to a control signal from DPA BIST controller 213. In the example of FIG. 2, interface block 214 transmits the test data signals to serializer 210 along a 10-bit bus having 10 parallel signal lines.

Serializer 210 is a parallel-to-serial converter circuit. Serializer 210 converts the parallel 10-bit test data signals from interface 214 into a serial stream of test data signals. The serial stream of test data signals is transmitted in serial from serializer 210 through the test mode serial loopback path identified in FIG. 2 to an input terminal of multiplexer 203. The test mode serial loopback path has only one signal line. Serializer 210 is only used during a built-in self-test of receiver channel 221. Serializer 210 is not used when receiver channel 221 is receiving input data signals through pins 201A-201B and LVDS input buffer 202.

During the built-in self-test of receiver channel 221, multiplexer 203 is configured to transmit the serial stream of test data signals from an output terminal of serializer 210 to an input terminal of DPA block 204. DPA block 204 compares the phases of the serial test data signals transmitted from serializer 210 to the phases of 8 different clock signals. The 8 clock signals have 8 different phases and the same frequency. The clock signals can, for example, be generated by a phase-locked loop. DPA block 204 selects the clock signal that has the best phase for sampling the serial test data signals. The selected clock signal is transmitted to deserializer 209. DPA block 204 outputs the serial stream of test data signals to FIFO buffer 205.

The serial test data signals output by DPA block 204 are stored in FIFO buffer 205. During the built-in self-test of receiver channel 221, multiplexer 207 transmits the serial test data signals from FIFO buffer 205 to BSLIP block 208. BSLIP block 208 slips (if necessary) a whole bit or multiple bits of the serial input data stream to realign the parallelization boundary in the data. For example, while LVDS is used for 4 bits of data, the data transmitter sends data bits ABCD-ABCDABCD etc., where each letter represents a bit, and bits A-D are a byte. On the receiving end, the deserializer in the receiver channel does not have the ability to determine that A is the most significant bit (MSB) and D is the least significant bit (LSB) in a byte. The deserializer may, for example, deserialize the data stream to be BCDA etc. BSLIP block 208 corrects this error by skipping one or more data bits in the serial input data stream in order for deserializer 209 to deserialize the data starting from the most significant bit.

The serial test data signals are transmitted from BSLIP block 208 to deserializer 209. Deserializer 209 includes a serial-to-parallel converter. Deserializer 209 samples the test data signals using the clock signal selected by DPA block 204 and converts the serial stream of test data signals from BSLIP block 208 into a parallel stream of test data signals. In the example of FIG. 2, deserializer 209 generates parallel test data signals that are transmitted along a 10-bit bus having 10 parallel signal lines.

The parallel test data signals are transmitted in parallel from deserializer 209 to user core logic 215 and to test verifier 211 through a 10-bit bus that has 10 parallel signal lines. Test verifier 211 also receives the original test data signals from test pattern generator 212. Test verifier 211 compares the original test data signals from test pattern generator 212 to the parallel test data signals received from deserializer 209. Test verifier 211 can, for example, determine if the bits in the original test data signals received from test pattern generator 212 are the same as the corresponding bits in the parallel test data signals received from deserializer 209. If test verifier 211 determines that these two sets of test data signals match, then receiver channel 221 has passed the built-in self-test. If test verifier 211 determines that these two sets of test data signals do not match, then receiver channel 221 has failed the built-in self-test. The BIST circuit 223 can perform the built-in self-test of receiver channel 221 using serializer 210 at the maximum frequency of receiver channel 221 (i.e., at-speed).

The configuration of FIG. 2 introduces about 12 additional ports. The 12 additional ports are the ports of DFT serializer 210 that are connected to core 222. The 12 additional ports include 10 parallel data input ports that receive the 10-bit parallel test data signals from BIST 223 in core 222. The other two ports of DFT serializer 210 receive a fast clock signal FCLK and a slow clock signal LDEN. The serializer FCLK and LDEN clock signals may be different from the deserializer FCLK and LDEN clock signals. All of these 12 additional ports are input ports. The additional ports generally do not have a serious impact on the core routing ability.

Often the LVDS output buffer in a transmitter channel is longer than the LVDS input buffer in a receiver channel. In order to maintain a rectangular shape for the core logic circuits in an integrated circuit, the receiver channel can be lengthened so that the transmitter channel and the receiver channel have the same length. Instead of inserting unused components into the receiver channel, a design for test (DFT) serializer can be fitted into the empty space in each receiver channel that results from lengthening the receiver channel to match the length of a transmitter channel. Because the receiver channel has empty space, inserting a serializer into the empty space in the receiver channel does not cause an additional die area increase in the receiver channel.

Figure 3:
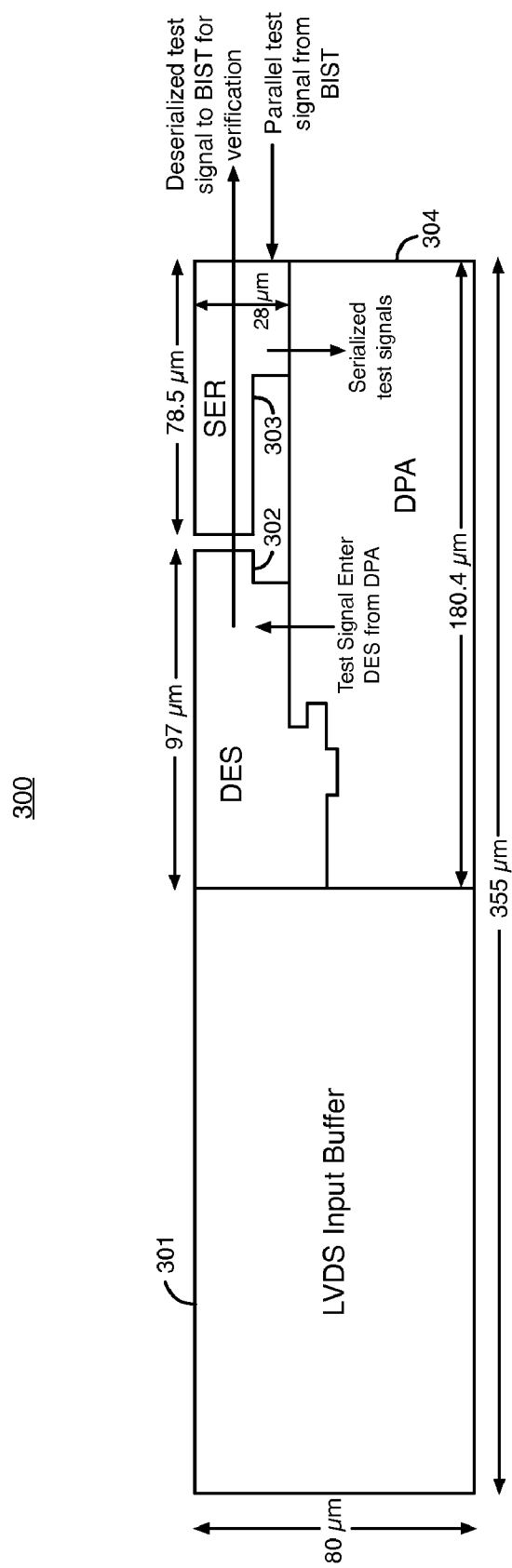
FIG. 3 is a layout diagram of a receiver channel on an integrated circuit that includes a design for test (DFT) serializer, according to an embodiment of the present invention.

FIG. 3 is a layout diagram of a receiver channel on an integrated circuit that includes a design for test (DFT) serializer, according to an embodiment of the present invention. LVDS receiver channel 300 in FIG. 3 illustrates an example of the layout of the receiver channel 221 in FIG. 2. Receiver channel 300 includes an LVDS input buffer 301, a deserializer 302, a serializer 303, and a DPA block 304. LVDS input buffer 301 receives LVDS input signals from differential input pins. LVDS input buffer 301 is not used during a built-in self-test of receiver channel 300. Receiver channel 300 does not include an LVDS output buffer.

During a built-in self-test of receiver channel 300, deserializer 302, serializer 303, and DPA block 304 function as described above with respect to the corresponding circuit blocks in FIG. 2. Specifically, serializer 303 converts parallel test data signals from the BIST circuitry into serial test data signals. The serial test data signals from serializer 303 are transmitted to DPA block 304. DPA block 304 selects the best clock signal for sampling the data and then transmits the serial test data signals to deserializer 302. Deserializer 302 deserializes the serial test data signals from DPA block 304 to generate deserialized parallel test data signals. Deserializer 302 transmits the deserialized parallel test data signals to the BIST circuitry for verification.

Although receiver channels 221 and 300 described herein are shown with DPA blocks, embodiments of the present invention can also be applied to a receiver channel that does not have a DPA block. According to another embodiment of the present invention, the BIST circuitry can be located in the receiver channel instead of in the core logic. According to yet another embodiment, the BIST circuitry can be hard-wired into the integrated circuit.

The dimensions of receiver channel 300 and sub-blocks within receiver channel 300 are shown in FIG. 3 for the purpose of illustration. The dimensions shown in FIG. 3 are not intended to limit the scope of the present invention to these specific examples. It should be understood that techniques of the present invention can be applied to receiver channels and sub-blocks having any suitable dimensions.

Receiver channel 300 in FIG. 3 has a length of 355 micrometers (μm) and a width of 80 micrometers (μm). Serializer block 303 has a maximum length of 78.5 μm and a maximum width of 28 μm. Thus, serializer block 303 takes up less than 7.8% of the total area of receiver channel 300. Deserializer block 302 has a maximum length of 97 μm and a variable width. DPA block 304 has a maximum length of 180.4 μm and a maximum width of 52 μm. Receiver channel 300 contains a small amount of empty space between deserializer 302, serializer 303, and DPA block 304.

The configurations shown in FIGS. 2 and 3 have several advantages. First, the configurations of FIGS. 2 and 3 enable at-speed testing for an LVDS receiver channel 221/300 at the maximum frequency of the receiver channel (e.g., 1 GHz) without relying on an external tester. The configurations of FIGS. 2 and 3 also do not require extra die area, because a small DFT serializer is inserted into the lengthened receiver channel instead of a large transmitter channel. The DFT serializer can utilize the empty space in the LVDS receiver channel that exists to extend the length of the receiver channel to match the length of the transmitter channel. In addition, the configurations of FIGS. 2 and 3 are advantageous for application specific integrated circuits (ASICs) in which only necessary blocks are instantiated, and thus, the transmitter and receiver channels are not necessarily grouped into pairs. In an integrated circuit having the configurations of FIGS. 2 and 3, the transmitter and receiver channels do not need to be grouped into pairs to implement at-speed built-in self-testing of the receiver channels.

Figure 4:
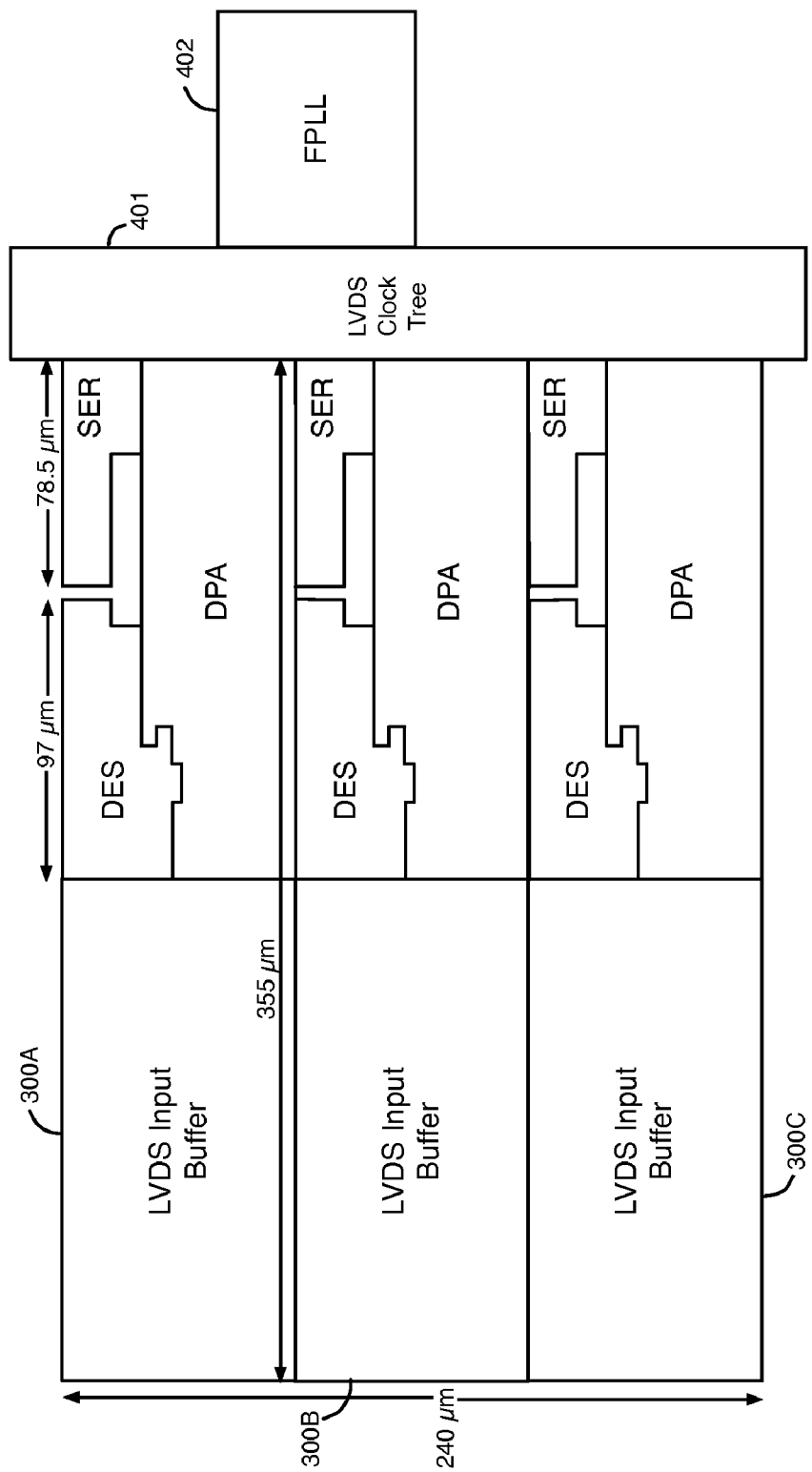
FIG. 4 is a layout diagram of three receiver channels on an integrated circuit that each include a DFT serializer, according to an embodiment of the present invention.

FIG. 4 is a layout diagram of three receiver channels on an integrated circuit that each include a DFT serializer, according to an embodiment of the present invention. Three LVDS receiver channels 300A, 300B, and 300C are laid out next to each other on the integrated circuit. Each of the receiver channels 300A-300C includes an LVDS input buffer, a deserializer (DES), a DFT serializer (SER), and a DPA block, as shown in FIG. 3 for receiver channel 300. A DFT serializer is added to each of the receiver channels 300A-300C to enable at-speed built-in self-tests of the receiver channels, as described above with respect to FIG. 2. Receiver channels 300A-300C do not include output buffers.

The dimensions of receiver channels 300A-300C and sub-blocks within receiver channels 300A-300C are shown in FIG. 4 for the purpose of illustration. The dimensions shown in FIG. 4 are not intended to limit the scope of the present invention to these specific examples. It should be understood that techniques of the present invention can be applied to receiver channels and sub-blocks having any suitable dimensions.

Receiver channels 300A-300C each have a length of 355 μm. The combined width of receiver channels 300A-300C is 240 μm. The deserializers in channels 300A-300C have a maximum length of 97 μm. The serializers in channels 300A-300C have a maximum length of 78.5 μm.

In the embodiment of FIG. 4, 8 clock signals having 8 unique phases are transmitted from fast phase-locked loop (FPLL) 402 to the DPA blocks in receiver channels 300A-300C through LVDS clock tree 401.

Figure 5:
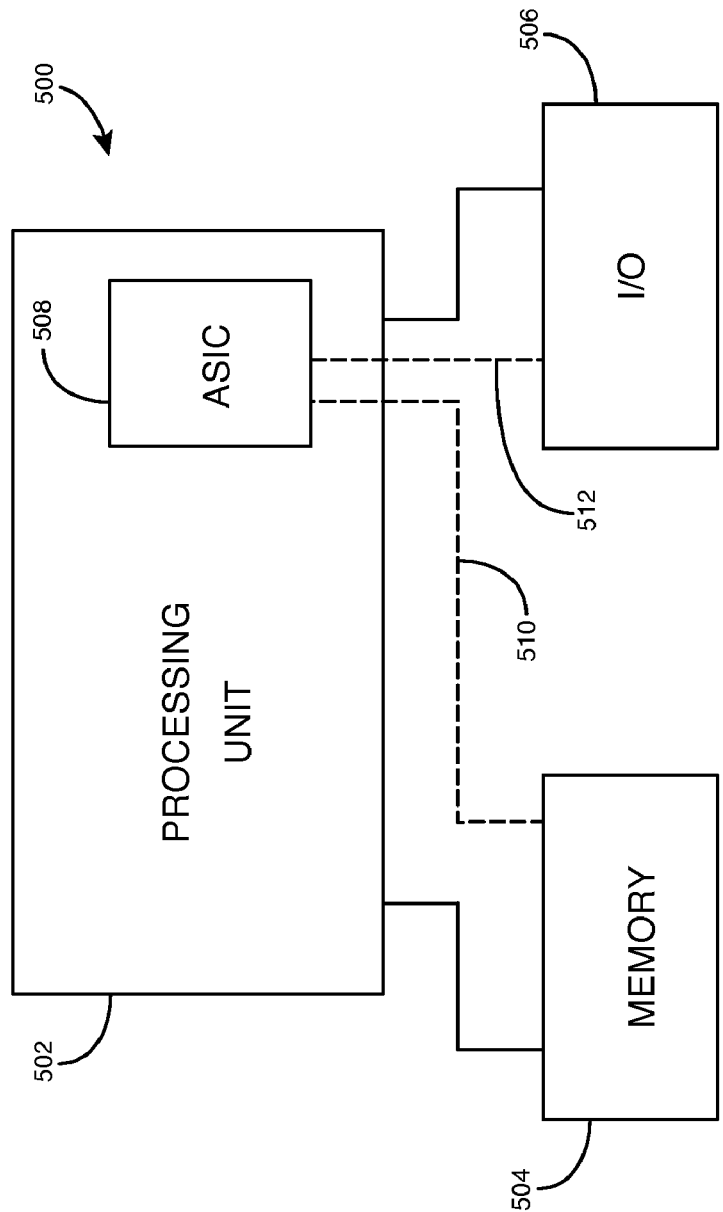
FIG. 5 shows a block diagram of an exemplary digital system that can embody techniques of the present invention.

The present invention can be implemented in a system that has an ASIC as one of several components. FIG. 5 shows a block diagram of an exemplary digital system 500 that can embody techniques of the present invention. System 500 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 500 can be provided on a single board, on multiple boards, or within multiple enclosures.

System 500 includes a processing unit 502, a memory unit 504, and an input/output (I/O) unit 506 interconnected together by one or more buses. According to this exemplary embodiment, an ASIC 508 is embedded in processing unit 502. ASIC 508 can serve many different purposes within the system of FIG. 5. ASIC 508 can, for example, be a logical building block of processing unit 502, supporting its internal and external operations. ASIC 508 can be specially coupled to memory 504 through connection 510 and to I/O unit 506 through connection 512.

Processing unit 502 can direct data to an appropriate system component for processing or storage, execute a program stored in memory 504, receive and transmit data via I/O unit 506, or other similar functions. Processing unit 502 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more ASICs 508 can control the logical operations of the system. Alternatively, ASIC 508 can itself include an embedded microprocessor. Memory unit 504 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention. For example, techniques of the present invention can be implemented in programmable integrated circuits, such as field programmable gate arrays and programmable logic devices.

What is claimed is:

1. A circuit comprising:
a receiver channel comprising a serializer and a deserializer; and
a built-in self-test circuit that generates test signals that are transmitted in parallel to the serializer during a test of the receiver channel, wherein the serializer converts the test signals into serial test signals, wherein the deserializer converts the serial test signals into parallel test signals that are transmitted to the built-in self-test circuit, and wherein the built-in self-test circuit compares the test signals to the parallel test signals to test the receiver channel.

2. The circuit defined in claim 1 wherein the receiver channel further comprises a dynamic phase alignment block that selects a clock signal for sampling data and that receives the serial test signals from the serializer in a test path between the serializer and the deserializer.

3. The circuit defined in claim 2 wherein the deserializer samples the test signals received from the dynamic phase alignment block using the selected clock signal.

4. The circuit defined in claim 3 wherein the receiver channel further comprises a bit slip block coupled to the deserializer.

5. The circuit defined in claim 1 wherein the receiver channel further comprises an input buffer having an input terminal coupled to an input pin, and wherein the receiver channel does not have an output buffer coupled to an output pin.

6. The circuit defined in claim 1 wherein the serializer is operable to generate serial output signals only in response to input test signals from the built-in self-test circuit during a test of the receiver channel.

7. The circuit defined in claim 1 further comprising:
a transmitter channel having a length, wherein a length of the receiver channel equals the length of the transmitter channel.

8. The circuit defined in claim 1 wherein the built-in self-test circuit comprises a test pattern generator that generates the test signals during the test and a test verifier that compares the test signals from the test pattern generator with the parallel test signals from the deserializer.

9. The circuit defined in claim 1 wherein the receiver channel has a maximum length of 355 micrometers and a maximum width of 80 micrometers.

10. The circuit defined in claim 1 wherein the serializer takes up less than 7.8% of a total area of the receiver channel.

11. The circuit defined in claim 1 wherein the circuit is fabricated on an integrated circuit, and the receiver channel is fabricated between two adjacent receiver channels that each comprise a serializer used only during built-in self-tests.

12. The circuit of claim 1 wherein the serializer is not in a transmitter.

13. The circuit of claim 12 wherein the serializer is not coupled to an output buffer.

14. A method for testing a receiver channel, the method comprising:
generating test signals during a built-in self-test using a built-in self-test circuit;
transmitting the test signals in parallel to the receiver channel;
serializing the test signals to generate serial test signals in the receiver channel using a serializer;
deserializing the serial test signals to generate parallel test signals in the receiver channel; and
comparing the test signals to the parallel test signals to test the receiver channel during the built-in self-test.

15. The method defined in claim 14 further comprising:
selecting a clock signal to sample the serial test signals in the receiver channel; and
sampling the serial test signals using the selected clock signal.

16. The method defined in claim 15 further comprising:
receiving input data signals; and
buffering the input data signals, wherein the receiver channel does not drive external output signals to an output pin.

17. The method defined in claim 14 wherein the serializer is operable to generate serial output signals only in response to input test signals from the built-in self-test circuit during a test of the receiver channel.

18. A circuit comprising:
a receiver channel comprising a serializer, a deserializer, and an input buffer configured to receive input signals from input pins of the circuit; and
a built-in self-test circuit that generates test signals for testing the receiver channel, wherein the built-in self-test circuit transmits the test signals to the serializer in parallel, wherein the serializer serializes the test signals to generate serial test signals that are transmitted to the deserializer, wherein the deserializer deserializes the serial test signals to generate parallel test signals that are transmitted to the built-in self-test circuit, and wherein the built-in self-test circuit compares the test signals to the parallel test signals to test the receiver channel.

19. The circuit defined in claim 18 wherein the receiver channel further comprises a dynamic phase alignment block that selects a clock signal for sampling data and that receives the serial test signals from the serializer in a test path between the serializer and the deserializer, and wherein the deserializer samples the data using the selected clock signal.

20. The circuit defined in claim 18 further comprising:
a transmitter channel comprising an output buffer configured to transmit output signals to an output pin, wherein a length of the receiver channel equals a length of the transmitter channel.

21. The circuit defined in claim 18 wherein the serializer has a maximum length of 78.5 micrometers and a maximum width of 28 micrometers.

22. The circuit defined in claim 18 wherein the serializer generates serial output signals only in response to input test signals from the built-in self-test circuit during a built-in self-test of the receiver channel.

* * * * *